US012802749B2

(12) United States Patent
Rawat et al.

(10) Patent No.: US 12,802,749 B2
(45) Date of Patent: *Nov. 17, 2026

(54) SERIAL WORD LINE ACTUATION WITH LINKED SOURCE VOLTAGE SUPPLY MODULATION FOR AN IN-MEMORY COMPUTE OPERATION WHERE SIMULTANEOUS ACCESS IS MADE TO PLURAL ROWS OF A STATIC RANDOM ACCESS MEMORY (SRAM)

(71) Applicant: STMicroelectronics International N.V., Geneva (CH)

(72) Inventors: Harsh Rawat, Faridabad (IN); Kedar Janardan Dhori, Ghaziabad (IN); Promod Kumar, Greater Noida (IN); Nitin Chawla, Noida (IN); Manuj Ayodhyawasi, Noida (IN)

(73) Assignee: STMicroelectronics Internationl N.V., Geneva (CH)

( * ) Notice: Subject to any disclaimer, the term of this patent is extended or adjusted under 35 U.S.C. 154(b) by 152 days.

This patent is subject to a terminal disclaimer.

(21) Appl. No.: 18/791,901

(22) Filed: Aug. 1, 2024

(65) Prior Publication Data

US 2024/0395319 A1 Nov. 28, 2024

Related U.S. Application Data

(63) Continuation of application No. 17/849,903, filed on Jun. 27, 2022, now Pat. No. 12,087,356.

(Continued)

(51) Int. Cl.
*G11C 11/418* (2006.01)

(52) U.S. Cl.
CPC .................................. *G11C 11/418* (2013.01)

(58) Field of Classification Search
CPC ..................................................... G11C 11/418
(Continued)

(56) References Cited

U.S. PATENT DOCUMENTS 6,198,671 B1 3/2001 Aoyama et al.
6,282,137 B1 8/2001 Lee et al.
(Continued)

FOREIGN PATENT DOCUMENTS

CN 106463165 A 2/2017
CN 110503995 A 11/2019
(Continued)

OTHER PUBLICATIONS

Agrawal, Amogh, et al: X-SRAM: Enabling In-Memory Boolean Computations in CMOS Static Random Access Memories, IEEE Transactions on Circuits and Systems-I: Regular Papers, vol. 65, No. 12, Dec. 2018.

(Continued)

*Primary Examiner* — Sung Il Cho
(74) *Attorney, Agent, or Firm* — Crowe & Dunlevy LLC

(57) ABSTRACT

SRAM cells are connected in columns by bit lines and connected in rows by first and second word lines coupled to first and second data storage sides of the SRAM cells. First the first word lines are actuated in parallel and then next the second word lines are actuated in parallel in first and second phases, respectively, of an in-memory compute operation. Bit line voltages in the first and second phases are processed to generate an in-memory compute operation decision. A low supply node reference voltage for the SRAM cells is selectively modulated between a ground voltage and a negative voltage. The first data storage side receives the negative voltage and the second data storage side receives the ground voltage during the second phase. Conversely, the second data storage side receives the negative voltage and (Continued)

the first data storage side receives the ground voltage during the first phase.

22 Claims, 8 Drawing Sheets

Related U.S. Application Data

(60) Provisional application No. 63/219,925, filed on Jul. 9, 2021.

(58) Field of Classification Search
USPC .......................................................... 365/154
See application file for complete search history.

(56) References Cited

U.S. PATENT DOCUMENTS

| | | | | |
|---|---|---|---|---|
| 6,529,400 | B1 | 3/2003 | Bhavnagarwala et al. | |
| 6,785,161 | B2 | 8/2004 | Pekny | |
| 7,120,061 | B2 | 10/2006 | Daga | |
| 7,173,837 | B1 * | 2/2007 | Bettman | G11C 15/04 365/49.1 |
| 7,227,769 | B2 | 6/2007 | Fukushi et al. | |
| 7,289,354 | B2 | 10/2007 | Houston | |
| 7,342,845 | B2 | 3/2008 | Somasekhar et al. | |
| 7,502,247 | B2 | 3/2009 | Houston | |
| 7,525,834 | B2 | 4/2009 | Sohn | |
| 7,564,725 | B2 | 7/2009 | Houston | |
| 7,570,527 | B2 | 8/2009 | Houston | |
| 7,692,964 | B1 | 4/2010 | Sabharwal et al. | |
| 7,742,326 | B2 | 6/2010 | Houston | |
| 7,760,575 | B2 | 7/2010 | Tooher et al. | |
| 7,773,407 | B2 | 8/2010 | Huang et al. | |
| 7,813,163 | B2 * | 10/2010 | Pille | G11C 11/413 365/189.14 |
| 7,885,093 | B2 | 2/2011 | Wielage et al. | |
| 8,004,907 | B2 | 8/2011 | Russell et al. | |
| 8,064,241 | B2 | 11/2011 | Morita et al. | |
| 8,134,874 | B2 | 3/2012 | Shiu et al. | |
| 8,213,257 | B2 | 7/2012 | Chuang et al. | |
| 8,441,829 | B2 | 5/2013 | Huang et al. | |
| 8,451,652 | B2 | 5/2013 | Seikh et al. | |
| 8,498,143 | B2 | 7/2013 | Deng | |
| 8,559,248 | B2 | 10/2013 | Dally et al. | |
| 8,634,263 | B2 | 1/2014 | Kenkare et al. | |
| 8,760,958 | B2 * | 6/2014 | Iyer | G11C 11/412 365/205 |
| 8,804,406 | B2 | 8/2014 | Rachamadugu et al. | |
| 8,902,672 | B2 | 12/2014 | Iyer et al. | |
| 8,947,970 | B2 | 2/2015 | Pelley et al. | |
| 8,964,451 | B2 | 2/2015 | Sheppard | |
| 8,966,329 | B2 | 2/2015 | Clark et al. | |
| 8,971,146 | B2 | 3/2015 | Sharpe-Geisler et al. | |
| 9,001,579 | B2 | 4/2015 | Song et al. | |
| 9,006,841 | B2 | 4/2015 | Kumar et al. | |
| 9,013,949 | B2 | 4/2015 | Schreiber et al. | |
| 9,087,566 | B2 | 7/2015 | Song et al. | |
| 9,142,284 | B2 | 9/2015 | Lee et al. | |
| 9,147,451 | B2 | 9/2015 | Chong et al. | |
| 9,165,642 | B2 | 10/2015 | Kumar | |
| 9,208,900 | B2 | 12/2015 | Sinangil et al. | |
| 9,257,199 | B2 | 2/2016 | Schreiber | |
| 9,263,121 | B2 | 2/2016 | Karl et al. | |
| 9,286,952 | B2 | 3/2016 | McLaury | |
| 9,324,384 | B2 | 4/2016 | Song et al. | |
| 9,336,865 | B1 * | 5/2016 | Chu | G11C 11/419 |
| 9,455,023 | B1 | 9/2016 | Xu et al. | |
| 9,558,812 | B2 | 1/2017 | Akerib | |
| 9,570,153 | B1 | 2/2017 | Chen et al. | |
| 9,627,040 | B1 | 4/2017 | Chang et al. | |
| 9,767,891 | B2 | 9/2017 | Zhang et al. | |
| 9,799,393 | B1 | 10/2017 | Ramamurthy et al. | |
| 9,831,852 | B2 | 11/2017 | Boakye et al. | |
| 9,928,898 | B2 | 3/2018 | Sahu et al. | |
| 9,940,994 | B2 | 4/2018 | Zhang et al. | |
| 9,953,699 | B2 | 4/2018 | Ichihashi | |
| 9,953,986 | B2 | 4/2018 | Wang | |
| 9,997,236 | B1 | 6/2018 | Pathak | |
| 10,319,434 | B2 | 6/2019 | Jung et al. | |
| 10,388,365 | B2 | 8/2019 | Zhang et al. | |
| 10,403,629 | B2 | 9/2019 | Mann et al. | |
| 10,446,225 | B1 | 10/2019 | Hoefler et al. | |
| 10,541,013 | B1 | 1/2020 | Schreiber et al. | |
| 10,559,573 | B2 | 2/2020 | Wang et al. | |
| 10,650,909 | B2 | 5/2020 | Chen et al. | |
| 10,679,694 | B2 | 6/2020 | Kumar et al. | |
| 10,685,703 | B2 | 6/2020 | Singh et al. | |
| 10,685,704 | B2 | 6/2020 | Wu et al. | |
| 10,748,911 | B2 | 8/2020 | Singh et al. | |
| 10,796,732 | B2 | 10/2020 | Yoshihara et al. | |
| 10,811,088 | B2 | 10/2020 | Raj et al. | |
| 10,839,906 | B2 | 11/2020 | Makosiej | |
| 11,048,434 | B2 | 6/2021 | Kumar et al. | |
| 2002/0105825 | A1 | 8/2002 | Marshall et al. | |
| 2006/0044018 | A1 | 3/2006 | Chang | |
| 2008/0144365 | A1 | 6/2008 | Yamaoka et al. | |
| 2008/0158939 | A1 * | 7/2008 | Chen | G11C 11/413 365/154 |
| 2009/0046519 | A1 | 2/2009 | Wang et al. | |
| 2011/0261633 | A1 | 10/2011 | Chandra et al. | |
| 2014/0185364 | A1 * | 7/2014 | Iyer | G11C 8/16 365/154 |
| 2014/0204657 | A1 | 7/2014 | Dally | |
| 2015/0179232 | A1 | 6/2015 | Felix et al. | |
| 2016/0232951 | A1 | 8/2016 | Shanbhag et al. | |
| 2018/0012648 | A1 * | 1/2018 | Ichihashi | G11C 11/419 |
| 2019/0042160 | A1 | 2/2019 | Kumar et al. | |
| 2019/0042199 | A1 | 2/2019 | Sumbul et al. | |
| 2019/0043560 | A1 | 2/2019 | Sumbul et al. | |
| 2019/0198093 | A1 | 6/2019 | Khellah et al. | |
| 2020/0075090 | A1 | 3/2020 | Kumar et al. | |
| 2021/0035614 | A1 | 2/2021 | Schreiber | |

FOREIGN PATENT DOCUMENTS

| | | | |
|---|---|---|---|
| CN | 112185447 | A | 1/2021 |
| EP | 0461430 | A1 | 12/1991 |
| EP | 3437098 | B1 | 7/2019 |
| KR | 1020200091697 | A | 7/2020 |
| WO | WO-0051131 | A1 | 8/2000 |

OTHER PUBLICATIONS

Biswas, Avishek, et al: CONF-SRAM: An Energy-Efficient SRAM With In-Memory Dot-Product Computation for Low-Power Convolution for Low-Power Convolutional Neural Networks, IEEE Journal of Solid-State Circuits, vol. 54, No. 1, Jan. 2019.

Biswas, Avishek: "Energy-Efficient Smart Embedded Memory Design for IoT and AI," Massachusetts Institute of Technology, Jun. 2018.

Calimera, Andrea, et al: "Design Techniques and Architectures for Low-Leakage SRAMs," IEEE Transactions on Circuits and Systems I: Regular Papers (vol. 59, Issue 9, Sep. 2012).

Chang, Chip-Hong, et al.: "Sizing of SRAM Cell with Voltage Biasing Techniques for Reliability Enhancement of Memory and PUF Functions," Journal of Low Power Electronics and Applications, 2016, 6, 16; doi:10.3390/jlpea6030016, 17 pgs.

CN110503995A English Translation.

Definition of "Buffer Amplifier," Wikipedia, 2021, 6 pgs.

Dong, Qing, et al: A 351TOPS/W and 372.4GOPS Compute-in-Memory SRAM Macro in 6nm FinFET CMOS for Machine-Learning Applications, ISSCC 2020, Session 15, SRAM & Compute-in-Memory, 15.3.

H. Jia et al., 15.1 A Programmable Neural-Network Inference Accelerator Based on Scalable In-Memory Computing, 2021 IEEE International Solid- State Circuits Conference (ISSCC), 2021, pp. 236-238, doi: 10.1109/ISSCC42613.2021.9365788.

H. Jia et al., Scalable and Programmable Neural Network Inference Accelerator Based on In-Memory Computing, in IEEE Journal of Solid-State Circuits, vol. 57, No. 1, pp. 198-211, Jan. 2022, doi: 10.1109/JSSC.2021.3119018.

(56) References Cited

OTHER PUBLICATIONS

J. Lee, H. Valavi, Y. Tang and N. Verma, Fully Row/Column Parallel In-memory Computing SRAM Macro employing Capacitor-based Mixed-signal Computation with 5-b Inputs, 2021 Symposium on VLSI Circuits, 2021, pp. 1-2, doi: 10.23919/VLSICircuits52068.2021.9492444.
J.-W. Su et al., 16.3 A 28nm 384kb 6T-SRAM Computation-in-Memory Macro with 8b Precision for AI Edge Chips, 2021 IEEE International Solid-State Circuits Conference (ISSCC), 2021, pp. 250-252, doi: 10.1109/ISSCC42613.2021.9365984.
Jia, Hongyang, et al: A Microprocessor Implemented in 65nm CMOS with Configurable and Bit-scalable Accelerator for Programmable In-memory Computing, IEEE Journal of Solid-State Circuits, vol. 55, No. 9, pp. 2609-2621, Sep. 2020.
Jia, Hongyang, et al: A Programmable Heterogeneous Microprocessor Based on Bit-Scalable In-Memory Computing, IEEE Journal of Solid-State Circuits, vol. 55, No. 9, Sep. 2020.
Jiang, Zhewei, et al: C3SRAM: An In-Memory-Computing SRAM Macro Based on Robust Capacitive Coupling Computing Mechanism, IEEE Journal of Solid-State Circuits, vol. 55, No. 7, Jul. 2020.
Kang, Mingu, et al: A Multi-Functional In-Memory Inference Processor Using a Standard 6T SRAM Array, IEEE Journal of Solid-State Circuits, vol. 53, No. 2, Feb. 2018.
Kim, Jinseok, et al: Area-Efficient and Variation-Tolerant In-Memory BNN Computing using 6T SRAM Array, 2019 Symposium on VLSI Circuits Digest of Technical Papers.
KR1020200091697A English Translation.
Kushwah, C.B., et al: "Single-Ended Boost-Less (SE-BL) 7T Process Tolerant SRAM Design in Sub-threshold Regime for Ultra-Low-Power Applications," Springer Link, Jun. 3, 2015.
Lin, Zhiting, et al.: "Cascade Current Mirror to Improve Linearity and Consistency in SRAM In-Memory Computing," IEEE Journal of Solid-State Circuits, vol. 56, No. 8, Aug. 2021, 13 pgs.
Lorenzo, Rohit, et al: "A novel 9T Sram architecture for low leakage and high performance," Analog Integrated Circuits and Signal Processing, 92, 315-325 (2017).
Luo, Shien-Chun, et al: "A Subthreshold SRAM Cell with Autonomous Bitline-Voltage Clamping," 2010 IEEE.
Nii, K., et al: "A 45-nm Single-port and Dual-port SRAM family with Robust Read/Write Stabilizing Circuitry under DVFS Environment," 2008 Symposium on VLSI Circuits Digest of Technical Papers.
Shakir, Tahseen: "Low-Power, Low-Voltage SRAM Circuit Designs for Nanometric CMOS Technologies," University of Waterloo thesis paper, 2011.
Si, Xin, et al: A 28nm 64Kb 6T Sram Computing-in-Memory Macro with 8b MAC Operation for AI Edge Chips, ISSCC 2020, Session 15, SRAM & Compute-in-Memorya, 15.5.
Si, Xin, et al: A Twin-8T SRAM Computation-In-Memory Macro for Multipe-Bit CNN-Based Machine Learning, ISSCC 2019, Session 24, SRAM & Computation-in-Memory, 24.5.
Singh, Jawar, et al: "A 2-Port 6T SRAM Bitcell Design with Multi-Port Capabilities at Reduced Area Overhead," 2010 IEEE.
Su, Jian-Wei, et al: A 28nm 64Kb Inference-Taining Two-Way Transpose Multibit 6T SRAM Compute-in-Memory Macro for AI Edge Chips, ISSCC 2020, Session 15, SRAM & Compute-in-Memory, 15.2.
Suzuki, Toshikazu, et al: "A Stable 2-Port SRAM Cell Design Against Simultaneously Read/Write-Disturbed Accesses," IEEE Journal of Solid-State Circuits, vol. 43, No. 9, Sep. 2008.
V. K. Rajanna, S. Taneja and M. Alioto, SRAM with In-Memory Inference and 90% Bitline Activity Reduction for Always-On Sensing with 109 TOPS/mm2 and 749-1,459 TOPS/W in 28nm, ESSDERC 2021—IEEE 51st European Solid-State Device Research Conference (ESSDERC), 2021, pp. 127-130, doi: 10.1109/ESSDERC53440.2021.9631782.
Valavi, Hossein, et al: A 64-Tile 2.4-Mb In-Memory-Computing CNN Accelerator Employing Charge-Domain Compute, IEEE Journal of Solid-State Circuits, vol. 54, No. 6, Jun. 2019.
Y.-D. Chih et al., 16.4 An 89TOPS/W and 16.3TOPS/mm2 All-Digital SRAM-Based Full-Precision Compute-In Memory Macro in 22nm for Machine-Learning Edge Applications, 2021 IEEE International Solid-State Circuits Conference (ISSCC), 2021, pp. 252-254, doi: 10.1109/ISSCC42613.2021.9365766.
Yin, Shihui, et al: XNOR-SRAM: In-Memory Computing SRAM Macro for Binary/Ternary Deep Neural Networks, IEEE Journal of So.id-State Circuits, vol. 55, No. 6, Jun. 2020.
Z. Chen, X. Chen and J. Gu, 15.3 A 65nm 3T Dynamic Analog RAM-Based Computing-in-Memory Macro and CNN Accelerator with Retention Enhancement, Adaptive Analog Sparsity and 44TOPS/W System Energy Efficiency, 2021 IEEE International Solid-State Circuits Conference (ISSCC), 2021, pp. 240-242, doi: 10.1109/ISSCC42613.2021.9366045.
Zhang, Jintao, et al.: "In-Memory Computation of a Machine-Learning Classifier in a Standard 6T SRAM Array," IEEE Journal of Solid-State Circuits, vol. 52, No. 4, Apr. 2017, 10 pgs.
Zhang, Jintao, et al: In-Memory Computation of a Machine-Learning Classifier in a Standard 6T SRAM Array, IEEE Journal of Solid-State Circuits, vol. 52, No. 4, Apr. 2017.
CN First Office Action and Search Report for counterpart, CN Appl. No. 202210805282.7, report dated Sep. 26, 2025, 14 pgs.

* cited by examiner

SERIAL WORD LINE ACTUATION WITH LINKED SOURCE VOLTAGE SUPPLY MODULATION FOR AN IN-MEMORY COMPUTE OPERATION WHERE SIMULTANEOUS ACCESS IS MADE TO PLURAL ROWS OF A STATIC RANDOM ACCESS MEMORY (SRAM)

CROSS REFERENCE TO RELATED APPLICATIONS

This application is a continuation of U.S. patent application Ser. No. 17/849,903, filed Jun. 27, 2022, which claims priority to United States Provisional Application for Patent No. 63/219,925, filed Jul. 9, 2021, the disclosures of which are incorporated by reference.

TECHNICAL FIELD

Embodiments herein relate to an in-memory computation circuit utilizing a static random access memory (SRAM) array and, in particular, to the performance of serial word line actuation for the simultaneous access of multiple rows of the SRAM array for an in-memory compute operation. In addition, the serial word line actuation may be linked to a modulation of the source supply voltage for the SRAM cells being accessed.

BACKGROUND

Reference is made to FIG. 1 which shows a schematic diagram of an in-memory computation circuit 10. The circuit 10 utilizes a static random access memory (SRAM) array 12 formed by standard 6T SRAM memory cells 14 arranged in a matrix format having N rows and M columns. As an alternative, a standard 8T memory cell or other bit cell with a similar topology and functionality could instead be used. Each memory cell 14 is programmed to store a bit of a computational weight for an in-memory compute operation. In this context, the in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of the computational weight has either a logic “1” or a logic “0” value.

Each SRAM cell 14 includes a word line WL and a pair of complementary bit lines BLT and BLC. The 8T-type SRAM cell would additionally include a read word line RWL and a read bit line RBT. The cells 14 in a common row of the matrix are connected to each other through a common word line WL (and through the common read word line RWL in the 8T-type implementation). The cells 14 in a common column of the matrix are connected to each other through a common pair of complementary bit lines BLT and BLC (and through the common read bit line RBL in the 8T-type implementation). Each word line WL, RWL is driven by a word line driver circuit 16 which may be implemented as a CMOS driver circuit (for example, a series connected p-channel and n-channel MOSFET transistor pair forming a logic inverter circuit). The word line signals applied to the word lines, and driven by the word line driver circuits 16, are generated from feature data input to the in-memory computation circuit 10 and controlled by a row controller circuit 18. A column processing circuit 20 senses the analog signal voltages on the pairs of complementary bit lines BLT and BLC (and/or on the read bit line RBL) for the M columns and generates a decision output for the in-memory compute operation from those analog signal voltages. The column processing circuit 20 can be implemented to support processing where the voltages on the columns are first processed individually and then followed by a recombination of multiple column outputs.

Although not explicitly shown in FIG. 1, it will be understood that the circuit 10 further includes conventional row decode, column decode, and read-write circuits known to those skilled in the art for use in connection with writing bits of the computational weight to, and reading bits of the computational weight from, the SRAM cells 14 of the memory array 12.

With reference now to FIG. 2, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. While FIG. 2 is specific to the use of 6T-type cells, those skilled in the art recognize that the 8T-type cell is similarly configured and would further include a signal path that is coupled to one of the storage nodes and includes a transfer (passgate) transistor coupled to the read word line RWL and gate driven by the signal on the read word line RWL. The word line driver circuit 16 is also typically coupled to receive the high supply voltage (Vdd) at the high supply node and is referenced to the low supply voltage (Gnd) at the low supply node.

The row controller circuit 18 performs the function of selecting which ones of the word lines WL<0> to WL<N−1> are to be simultaneously accessed (or actuated) in parallel during an in-memory compute operation, and further functions to control application of pulsed signals to the word lines in accordance with the feature data for that in-memory compute operation. FIG. 1 illustrates, by way of example only, the simultaneous actuation of all N word lines with the pulsed word line signals, it being understood that in-memory compute operations may instead utilize a simultaneous actuation of fewer than all rows of the SRAM array. The analog signal voltages which develop on a given pair of complementary bit lines BLT and BLC (or develop on the read bit line RBL in the 8T-type implementation) are dependent on the logic state of the bits of the computational weight stored in the memory cells 14 of the corresponding column and the width(s) of the pulsed word line signals for the feature data applied to those memory cells 14.

The implementation illustrated in FIG. 1 shows an example in the form of a pulse width modulation (PWM) for the applied word line signals for the in-memory compute operation. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines in response to the feature data. Furthermore, in a simpler implementation, it will be understood that all applied word line signals in the simultaneous actuation may instead have a same pulse width.

FIG. 3 is a timing diagram showing assertion (logic high) of a precharge control signal PCH which causes a bit line precharge circuit to charge the pair of complementary bit lines BLT and BLC to the Vdd voltage level, and then the deassertion (logic low) of the precharge control signal PCH followed by the simultaneous application of the pulse width modulated word line signals to plural rows of memory cells 14 in the SRAM array 12 in response to the feature data for a computation cycle of a given in-memory compute operation. Analog signal voltages Va,T and Va,C develop over time on the pair of complementary bit lines BLT and BLC, respectively, falling from the precharge voltage Vdd in response to the pulse width(s) of those word line signals and the logic state of the bits of the computational weight stored in the memory cells 14. The representation of the analog voltage Va levels as shown is just an example. The precharge control signal PCH is again asserted at the end of the computation cycle to return the bit line voltages to the precharge Vdd level in advance of the next computation cycle. It will be noted that a risk exists that the analog voltage on at least one of the bit lines BLT and BLC may fall from the precharge (Vdd) voltage to a level where an unwanted data flip occurs with respect to the stored data bit value in one of the memory cells 14 of the column. For example, a logic "1" state stored in the cell 14 of a column may be flipped to a logic "0" state. This data flip introduces a data error in the computational weight stored in the memory cells, thus jeopardizing the accuracy of subsequent in-memory compute operations.

The unwanted data flip that occurs due to an excess of bit line voltage lowering is mainly an effect of the simultaneous parallel access of the word lines in matrix vector multiplication mode during the in-memory compute operation. This problem is different from normal data flip of an SRAM bit cell due to Static-Noise-Margin (SNM) issues which happens in serial bit cell access when the bit line is close to the level of the supply voltage Vdd. During serial access, the normal data flip is instead caused by a ground bounce of the data storage nodes QT or QC.

A known solution to address the serial bit cell access SNM failure concern is to lower the word line voltage by a small amount and this is generally achieved by a short circuit of the word line driver and the use of a bleeder path. However, parallel access of multiple word lines during an in-memory compute operation instead needs Radical-WL Lowering/Modulation (RWLM). Additionally, a known solution to address the foregoing problem is to apply a fixed word line voltage lowering (for example, to apply a voltage VWLUD equal to Vdd/2) on all integrated circuit process corners in order to secure the worst integrated circuit process corner. This word line underdrive (WLUD) solution, however, has a known drawback in that there is a corresponding reduction in read current on the bit lines which can have a negative impact on computation performance. Furthermore, the use of a fixed word line underdrive voltage can increase variability of the read current across the array leading to accuracy loss for the in-memory compute operation.

Another solution is to utilize a specialized bitcell circuit design for each memory cell 14 that is less likely to suffer from an unwanted data flip during simultaneous (parallel) access of multiple rows for the in-memory compute operation. A concern with this solution is an increase in occupied circuit area for such a bitcell circuit. It would be preferred for some in-memory computation circuit applications to retain the advantages provided by use of the standard 6T SRAM cell (FIG. 2) or 8T SRAM cell in the array 12.

There is accordingly a need in the art to support in-memory computation circuit use of a standard 6T (or 8T) SRAM cell while ensuring against unwanted data flip during simultaneous row access.

SUMMARY

In an embodiment, a circuit comprises: a memory array including a plurality of static random access memory (SRAM) cells arranged in a matrix with plural rows and plural columns, each column including a pair of bit lines connected to the SRAM cells of the column, and each row including: a first word line configured to drive a first passgate transistor of the SRAM cell coupled between a first data node of the SRAM cell and one bit line of the pair of bit lines; and a second word line configured to drive a second passgate transistor of the SRAM cell coupled between a second data node of the SRAM cell and another bit line of the pair of bit lines; a first word line driver circuit for each row having an output connected to drive the first word line of the row; a second word line driver circuit for each row having an output connected to drive the second word line of the row; a row controller circuit configured to simultaneously actuate only the first word lines in a first phase of an in-memory compute operation by applying pulses through the first word line driver circuits to the first word lines and then simultaneously actuate only the second word lines in a second phase of the in-memory compute operation by applying pulses through the second word line driver circuits to the second word lines; a column processing circuit connected to the pair of bit lines for each column and configured to process analog voltages developed on the pairs of bit lines in response to the first and second phases of the in-memory compute operation to generate a decision output; and a source supply modulation circuit configured to switch a modulated reference supply voltage for the SRAM cells from a ground voltage to a negative voltage during the first and second phases of the in-memory compute operation.

In an embodiment, a circuit comprises: a memory array including a plurality of memory cells, each memory cell comprising a latch circuit including a first side with a first data node and a first low supply node and further including a second side with a second data node and a second low supply node; wherein the plurality of memory cells are arranged in a matrix with plural rows and plural columns, each column including a pair of bit lines connected to the memory cells of the column, and each row including a first word line connected to the first side of the latch circuit and a second word line connected to the second side of the latch circuit; a row controller circuit configured to simultaneously apply pulses only to the first word lines in a first phase of an in-memory compute operation then simultaneously apply pulses only to the second word lines in a second phase of the in-memory compute operation; a column processing circuit connected to the pair of bit lines for each column and configured to process analog voltages developed on the pairs of bit lines in response to the first and second phases of the in-memory compute operation to generate a decision output; and a source supply modulation circuit configured to switch a first modulated reference supply voltage at the first low supply node from a ground voltage to a negative voltage during the second phase, and to switch a second modulated reference supply voltage at the second low supply node from the ground voltage to the negative voltage during the first phase.

In an embodiment, a circuit comprises SRAM cells connected in columns by bit lines and connected in rows by first and second word lines coupled to first and second data storage sides of the SRAM cells. For an in-memory compute operation, the first word lines are actuated in parallel and then the second word lines are actuated in parallel in first and second phases, respectively. Bit line voltages in the first and second phases are processed to generate an in-memory compute operation decision. A low supply node reference voltage for the SRAM cells is selectively modulated between a ground voltage and a negative voltage in a manner that is linked to the serial access of the SRAM cells using the first and second word lines. The first data storage side receives the negative voltage and the second data storage side receives the ground voltage during the second phase when the second word lines are being simultaneously actuated in parallel. Conversely, the second data storage side receives the negative voltage and the first data storage side receives the ground voltage during the first phase when the first word lines are being simultaneously actuated in parallel.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
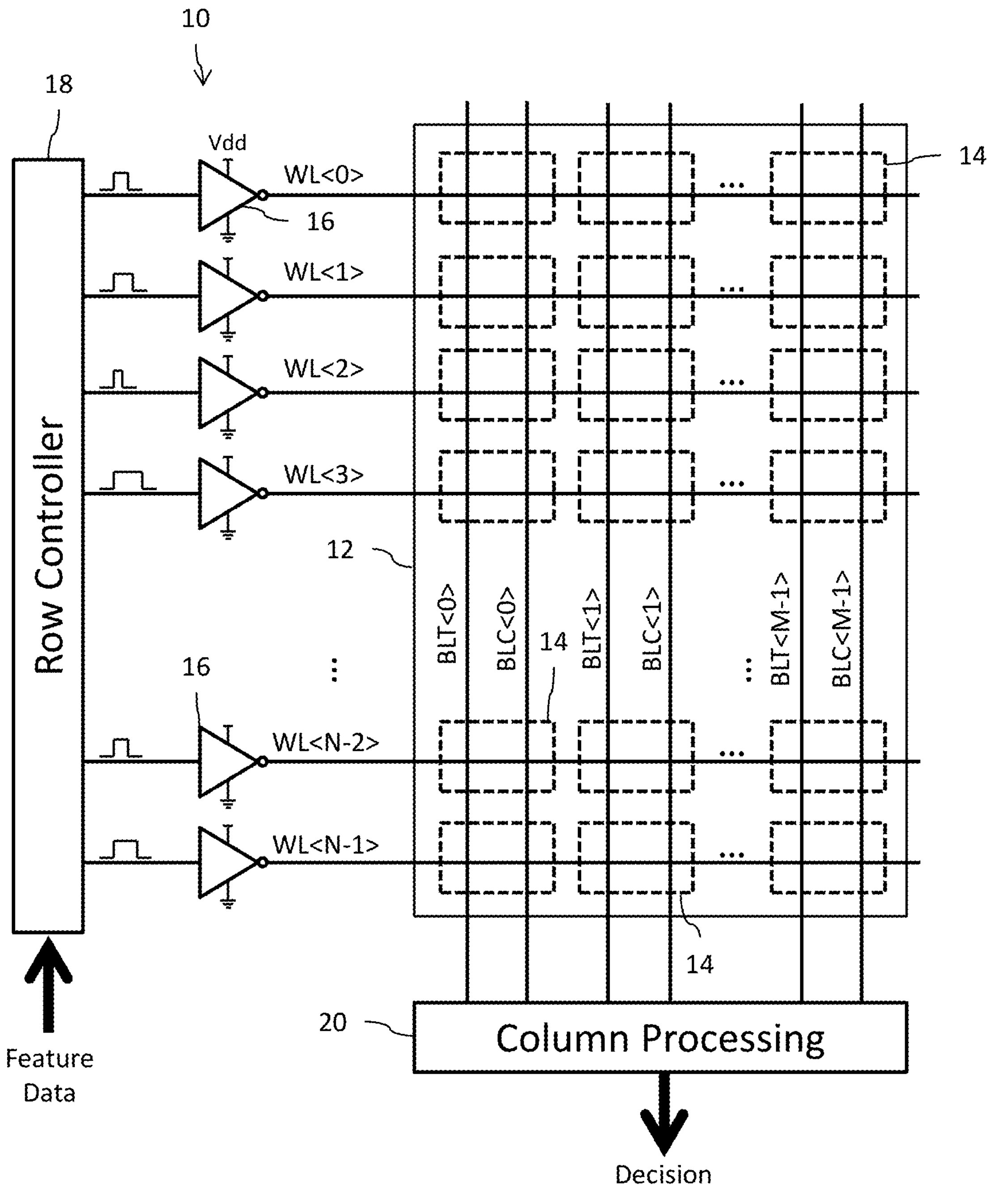
FIG. 1 is a schematic diagram of an in-memory computation circuit.
Figure 4:
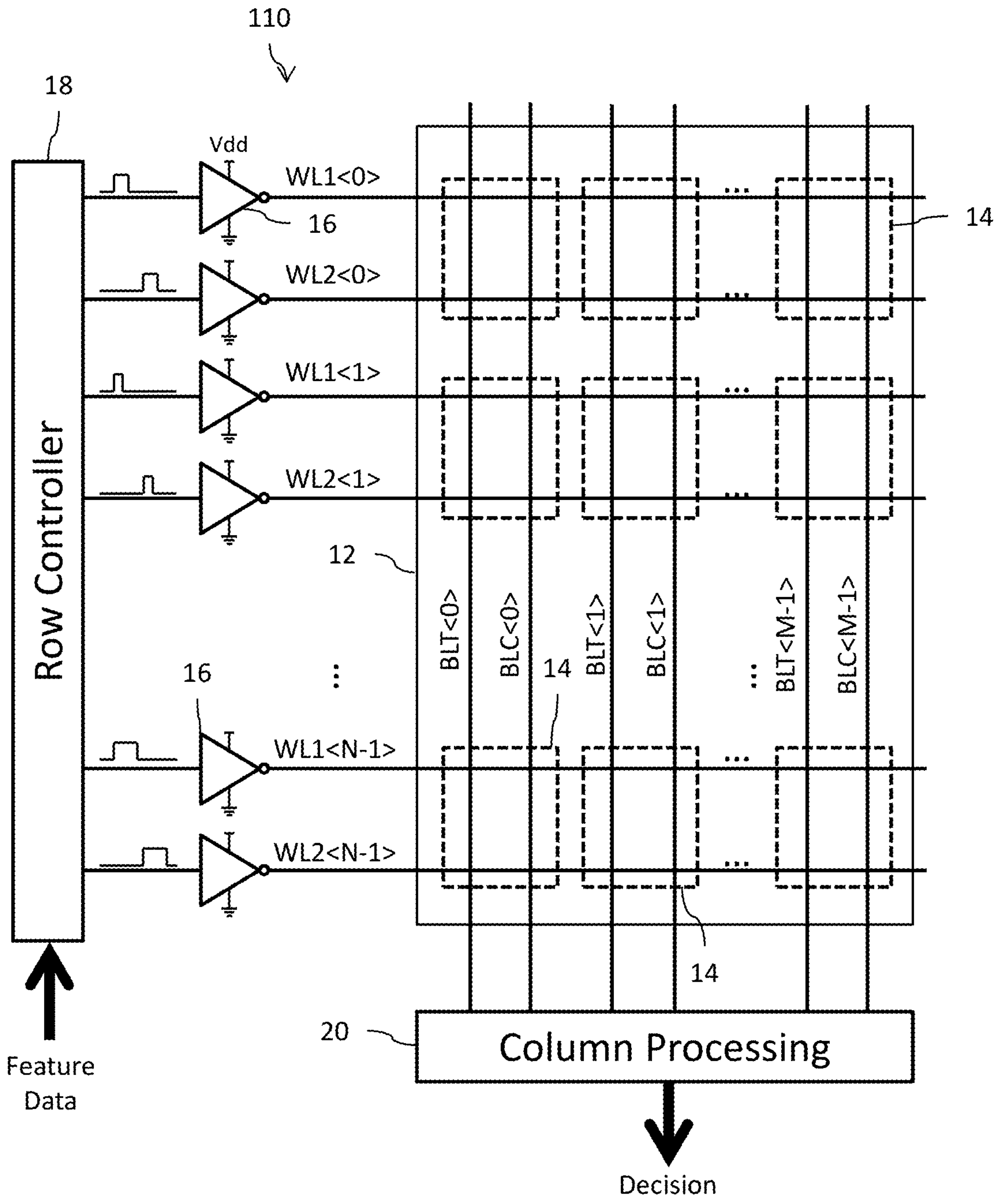
FIG. 4 is a circuit diagram for an embodiment of a circuit for providing a time multiplexed bit line overdrive voltage and access.
Figure 5:
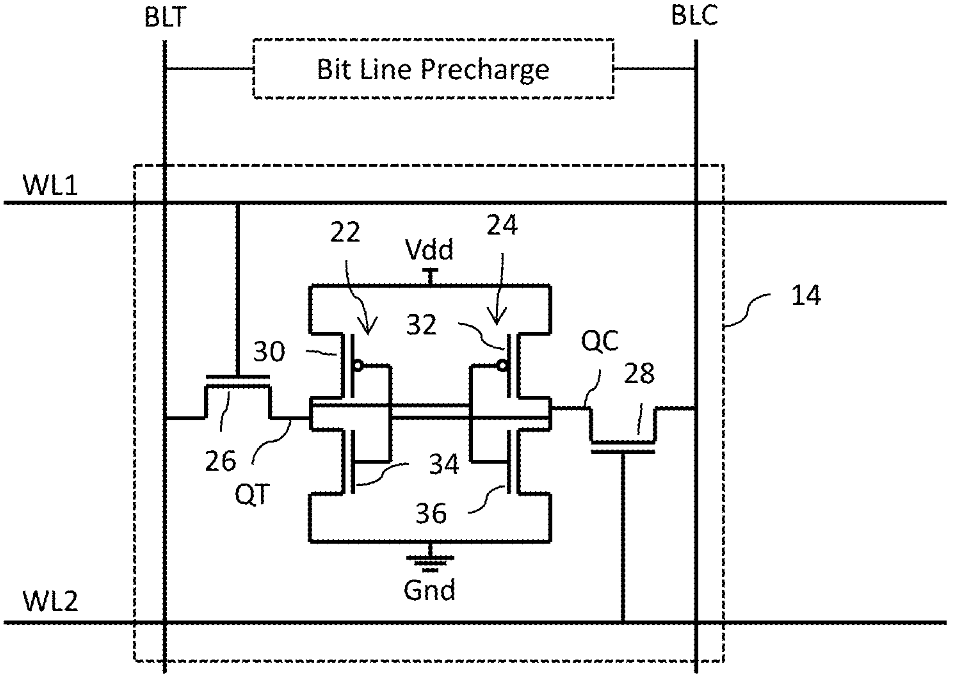
FIG. 5 is a circuit diagram of the 6T SRAM cell as used the memory array of the in-memory computation circuit shown in FIG. 4.

Reference is now made to FIG. 4 which shows a schematic diagram of an in-memory computation circuit 110. Like references in FIGS. 1 and 4 refer to like or similar components, the description of which will not be repeated (see, description above). The circuit 110 differs from the circuit 10 in that word line access control for the true and complement sides of the latch for each SRAM cell has been split as shown in more detail in FIG. 5. Each cell 14 includes a first transfer (passgate) transistor 26 for the true side of the latch having a gate terminal driven by a first word line WL1. Transistor 26 is source-drain connected between the true data storage node QT and a node associated with a true bit line BLT. Each cell 14 further includes a second transfer (passgate) transistor 28 for the complement side of the latch having a gate terminal driven by a second word line WL2. Transistor 28 is source-drain connected between the complement data storage node QC and a node associated with a complement bit line BLC. With this configuration, independent control over word line access to each side of the memory cell 14 can be made. The circuit further supports the performance of one phase (a first phase p1) of the in-memory compute operation associated with actuation of only the first word lines WL1 in response to the feature data to access/read the true side of the latch and the performance of another phase (a second phase p2) of the in-memory compute operation associated with actuation of only the second word lines WL2 in response to the feature to access/read the complement side of the latch. The word lines signals applied to the first and second word lines WL1 and WL2 are generated in response to the same feature data and will have the same pulse width.

Figure 6:
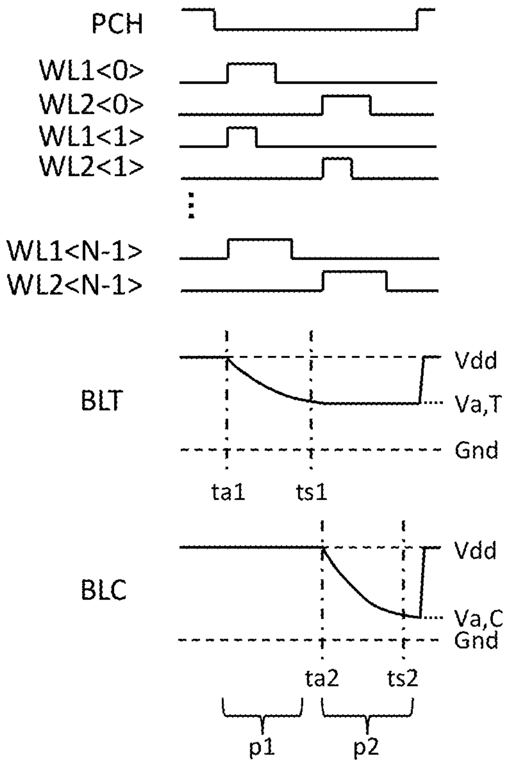
FIG. 6 is a timing diagram illustrating an in-memory compute operation for the circuit of FIG. 4.

FIG. 6 is a timing diagram showing circuit operation for a computation cycle of an in-memory compute operation that is executed in a time multiplexed manner with respect to the true and complement sides of the latches for the SRAM cells in a given column of the array. The true bit line BLT and the complement bit line BLC of the given column are both precharged by the bit line precharge circuit to a desired voltage level (here shown, by way of example, to the Vdd voltage level, although other voltage levels could be selected). In a first phase p1 of the computation cycle starting at time ta1, where access is being made to the true sides of the latch circuits, bit line precharge is terminated and a simultaneous application of the pulse width modulated word line signals is made by the row controller circuit 18 to only the first word lines WL1 of plural rows of memory cells 14 in the SRAM array 12 in response to the feature data for a given in-memory compute operation. An analog signal voltage Va,T develops over time on the true bit line BLT, falling from the precharge voltage level Vdd in response to the pulse width(s) of those word line signals and the logic state of the bits of the computational weight stored on the true side of the memory cells 14. The representation of the analog voltage Va,T level as shown is just an example.

In a second phase p2 of the computation cycle starting at time ta2, where access is being made to the complement sides of the latch circuits, a simultaneous application of the pulse width modulated word line signals (with the same feature data and pulse width as in phase p1) is made by the row controller circuit 18 to only the second word lines WL2 of plural rows of memory cells 14 in the SRAM array 12 in response to the feature data for the given in-memory compute operation. An analog signal voltage Va,C develops over time on the complement bit line BLC, falling from the precharge voltage level Vdd in response to the pulse width (s) of those word line signals and the logic state of the bits of the computational weight stored on the complement true side of the memory cells 14. The representation of the analog voltage Va,C level as shown is just an example.

The column processing circuit 20 senses the analog signal voltages on the pairs of complementary bit lines BLT and BLC for the M columns and generates a decision output for the in-memory compute operation from those analog signal voltages. It will be noted that sampling of the analog signal voltages Va,T and Va,C is typically made by the column processing circuit 20 at two separate times, first in association with the simultaneous application of the pulse width modulated word line signals to the first word lines WL1 during the first phase p1 (at time ts1), where access is being made to the true side of the latch circuit, and second in association with the simultaneous application of the pulse width modulated word line signals to the second word lines WL1 during the second phase p2 (at time ts2), where access is being made to the complement side of the latch circuit. Post-sampling (i.e., at or after time ts2) the bit lines are precharged back to the precharge voltage level.

Figure 7:
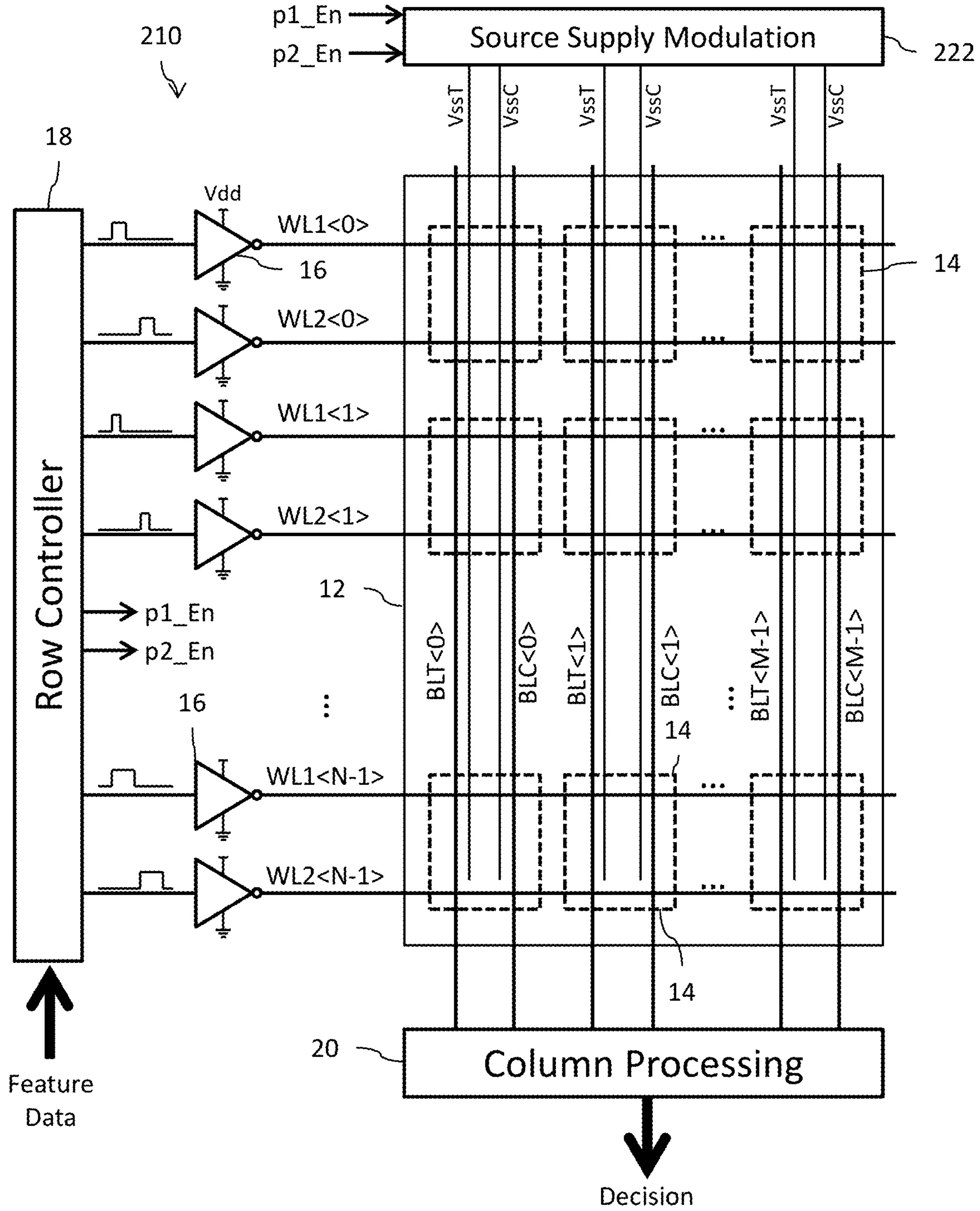
FIG. 7 is a circuit diagram for an embodiment of a circuit for providing a time multiplexed bit line overdrive voltage and access linked to source supply modulation.
Figure 8:
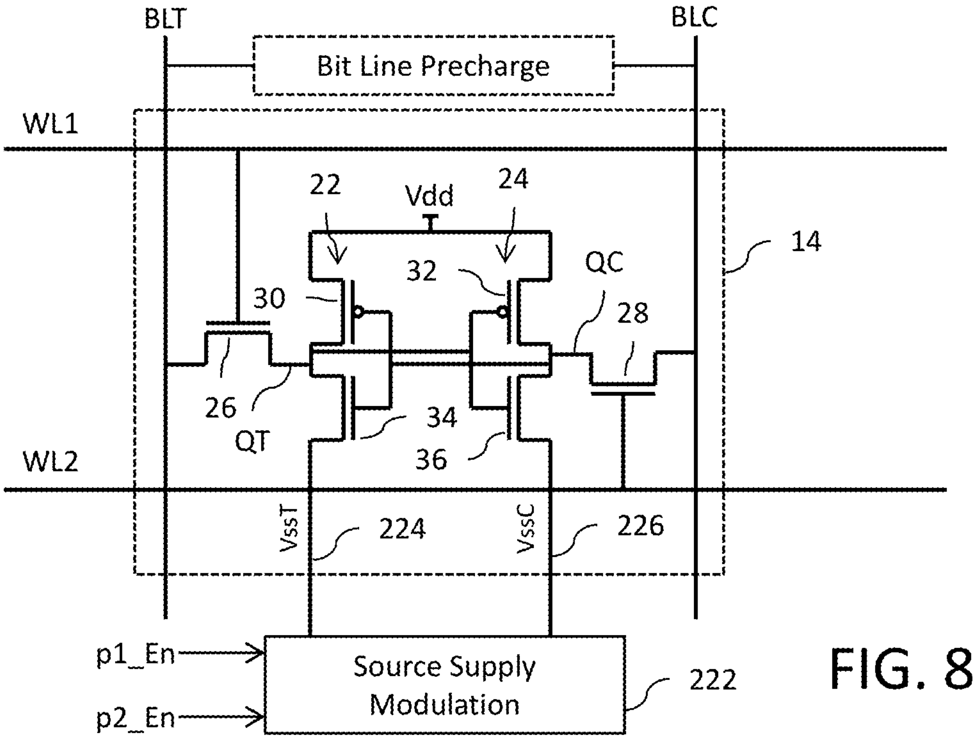
FIG. 8 is a circuit diagram of the 6T SRAM cell as used the memory array of the in-memory computation circuit shown in FIG. 7.

Reference is now made to FIG. 7 which shows a schematic diagram of an in-memory computation circuit 210. Like references in FIGS. 1 and 7 refer to like or similar components, the description of which will not be repeated (see, description above). The circuit 210 differs from the circuit 10 in that word line access control for the true and complement sides of the latch for each SRAM cell has been split as shown in more detail in FIG. 8. Each cell 14 includes a first transfer (passgate) transistor 26 for the true side of the latch circuit having a gate terminal driven by a first word line WL1. Transistor 26 is source-drain connected between the true data storage node QT and a node associated with a true bit line BLT. Each cell 14 further includes a second transfer (passgate) transistor 28 for the complement side of the latch circuit having a gate terminal driven by a second word line WL2. Transistor 28 is source-drain connected between the complement data storage node QC and a node associated with a complement bit line BLC. With this configuration, independent control over word line access to each side of the latch circuit for the memory cell 14 can be made. The circuit further supports the performance of one phase (a first phase p1) of the in-memory compute operation associated with actuation of only the first word lines WL1 for accessing/reading the true side of the latch circuit in response to the feature data and the performance of another phase (a second phase p2) of the in-memory compute operation associated with actuation of only the second word lines WL2 for accessing/reading the complement side of the latch circuit in response to the feature data. The word line signals on the first and second word lines WL1 and WL2 are generated in response to the feature data and will have the same pulse width.

Figure 2:
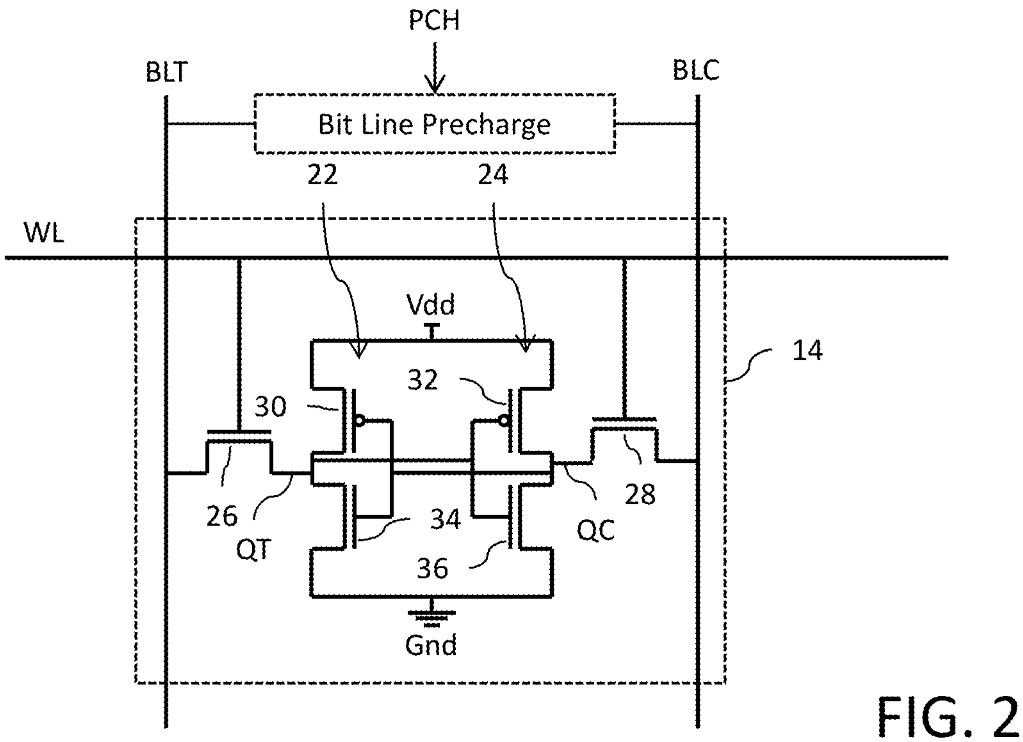
FIG. 2 is a circuit diagram of a standard 6T static random access memory (SRAM) cell as used the memory array of the in-memory computation circuit shown in FIG. 1.
Figure 3:
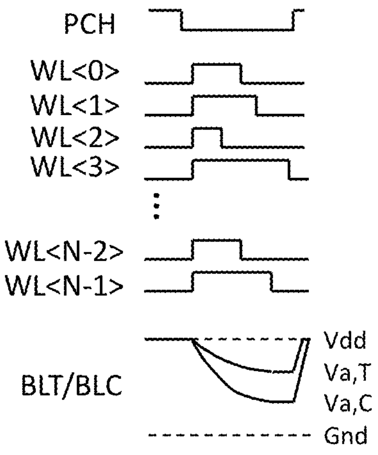
FIG. 3 is a timing diagram illustrating an in-memory compute operation for the circuit of FIG. 1.

The circuit 210 further differs from the circuit 10 in that a source supply modulation circuit 222 is provided to control the reference voltage level at the source terminals of the pull down transistors in each SRAM cell 14 (i.e., there is separate modulation of the voltage at the low supply nodes for the inverters on each side of the latch circuit). Each memory cell 14 includes two cross-coupled CMOS inverters 22 and 24 forming the latch circuit. The source terminals of the p-channel transistors 30 and 32 in each inverter 22 and 24 are coupled to receive a high supply voltage (for example, a positive voltage Vdd) at a high supply node. However, different from the implementation shown in FIGS. 2 and 5, the source terminals of the (pull down) n-channel transistors 34 on the true side of the latch circuit associated with data storage node QT are coupled to receive a (first) modulated reference supply voltage VssT at a true low supply node 224, and the source terminals of the (pull down) n-channel transistors 36 on the complement side of the latch circuit associated with the data storage node QC are coupled to receive a (second) modulated reference supply voltage VssC at a complement low supply node 226. The voltage levels for the modulated reference supply voltage VssT at the true side of the latch circuit and the modulated reference supply voltage VssC at the complement side of the latch circuit are independently controllable. In particular, each of the voltage levels is selectively controllable by the source supply modulation circuit 222 to be at either at the ground reference voltage (Gnd) or at a negative reference voltage (Vneg). Even more specifically, as will be explained in detail below, the modulation of the voltages at the true low supply node 224 and the complement low supply node 226 (for example, switching between Gnd and Vneg levels) is dependent on the phase of operation of the circuit 210 in connection with the performance of an in-memory compute operation and can be linked to the independent control over word line access to each side of the latch circuit for the memory cell 14.

It will be noted that the negative absolute value of the voltage Vneg is preferably limited by: a) the retention of a logic 1 state on the QT node when the source of the pull down transistor 34 is taken to the negative voltage level and the second word line WL2 is asserted, and b) the retention of a logic 1 state on the QC node when the source of the pull down transistor 36 is taken to the negative voltage level and the first word line WL1 is asserted.

The row controller circuit 18 asserts a phase p1 enable signal p1_En whenever phase p1 of the in-memory compute operation is being performed. The source supply modulation circuit 222 responds to assertion of the phase p1 enable signal p1_En, where access is being made to the true side of the latch circuit, by selectively switching the voltage level for the modulated reference supply voltage VssC at the complement low supply node 226, for the complement side of the latch circuit in each SRAM cell 14, to the negative reference voltage Vneg. It will be noted that this selective switching does not have any effect on the voltage level of the modulated reference supply voltage VssT at the true low supply node 224 in each SRAM cell 14 which is maintained at the ground reference voltage Gnd. Similarly, the row controller circuit 18 asserts a phase p2 enable signal p2_En whenever phase p2 of the in-memory compute operation is being performed. The source supply modulation circuit 222 responds to assertion of the phase p2 enable signal p2_En, where access is being made to the complement side of the latch circuit, by selectively switching the voltage level for the modulated reference supply voltage VssT at the true low supply node 224, for the true side of the latch circuit in each SRAM cell 14, to the negative reference voltage Vneg. It will be noted that this selective switching does not have any effect on the voltage level for the modulated reference supply voltage VssC at the complement low supply node 226 in each SRAM cell 14 which is maintained at the ground reference voltage Gnd.

Figure 9:
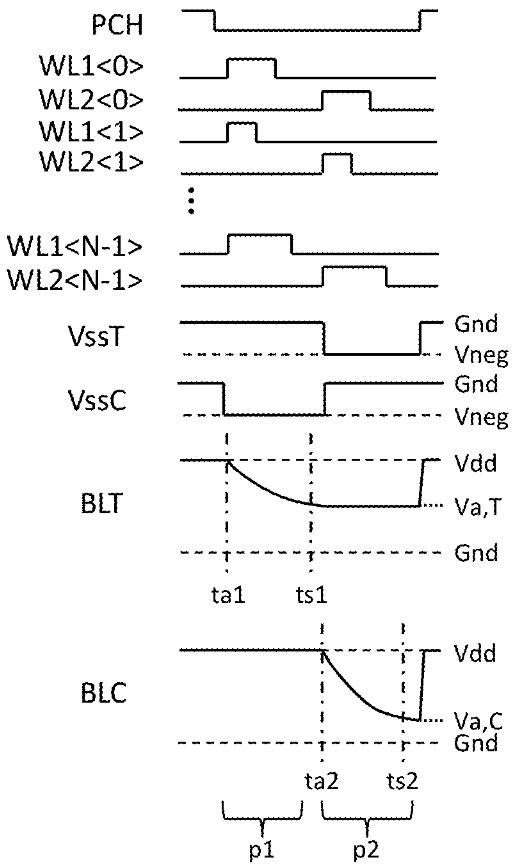
FIG. 9 is a timing diagram illustrating an in-memory compute operation for the circuit of FIG. 7.

FIG. 9 is a timing diagram showing circuit operation for a computation cycle of an in-memory compute operation that is executed in a time multiplexed manner with respect to access/read of the true and complement sides of the latch for the SRAM cells 14 in a given column of the array, wherein this operation is linked with a modulation of the voltage level at the true low supply node 224 in each SRAM cell 14 and a modulation of voltage level at the complement low supply node 226 in each SRAM cell 14. The true bit line BLT and the complement bit line BLC of the given column are both precharged by the bit line precharge circuit to a desired voltage level (here shown, by way of example, to the Vdd voltage level; but it will be understood that another voltage level for the precharge voltage could be used).

In a first phase p1 of the computation cycle starting at time ta1, precharge of the bit lines is terminated and the source supply modulation circuit 222 responds to the assertion of the phase p1 enable signal p1_En, associated with accessing the true sides of the latches, by switching the voltage level for the modulated reference supply voltage VssC, associated with complement sides of the latches at the complement low supply node 226 in each SRAM cell 14, from the ground voltage Gnd to the negative reference voltage Vneg (while maintaining the voltage level for the modulated reference supply voltage VssT at the true low supply node 224 in each SRAM cell 14 at the ground reference voltage Gnd). The row controller circuit 18 further simultaneously applies the pulse width modulated word line signals to only the first word lines WL1 of plural rows of memory cells 14 in the SRAM array 12 in response to the feature data for a given in-memory compute operation on the true side (i.e., at the true data storage nodes QT and the bit line BLT). An analog signal voltage Va,T develops over time on the true bit line BLT, falling from the precharge voltage level Vdd in response to the pulse width(s) of those word line signals and the logic state of the bits of the computational weight stored on the true side of the memory cells 14. The representation of the analog voltage Va,T level as shown is just an example. The advantageous effect of modulating the voltage level for the modulated reference supply voltage VssC at the complement low supply nodes 226 to the negative reference voltage Vneg on the opposite side of the latch circuit from the read access is to enhance the strength of the (pull up) p-channel transistors 30 in each cell 14 for holding the logic "1" state stored at the complement data storage node QC. This provides for an improved immunity against unwanted data flip from logic "1" to logic "0" due to the drop in the analog voltage Va, T level on the true side of the latch circuit.

In a second phase p2 of the computation cycle starting at time ta2, the source supply modulation circuit 222 in responds to assertion of the phase p2 enable signal p2_En, associated with accessing the complement sides of the latches, by switching the voltage level for the modulated reference supply voltage VssT, associated with the true sides of the latches at the true low supply node 224 in each SRAM cell 14, to the negative reference voltage Vneg (while maintaining the voltage level for the modulated reference supply voltage VssC at the complement low supply node 226 in each SRAM cell 14 at the ground reference voltage Gnd). The row controller circuit 18 further simultaneously applies the pulse width modulated word line signals (with the same feature data and pulse width as in phase p1) to only the second word lines WL2 of plural rows of memory cells 14 in the SRAM array 12 in response to the feature data for the given in-memory compute operation on the complement side (i.e., at the complement data storage nodes QC and the bit line BLC). An analog signal voltage Va,C develops over time on the complement bit line BLC, falling from the precharge voltage level Vdd in response to the pulse width (s) of those word line signals and the logic state of the bits of the computational weight stored on the complement side of the memory cells 14. The representation of the analog voltage Va,C level as shown is just an example. The advantageous effect of modulating the voltage level for the modulated reference supply voltage VssT at the true low supply nodes 224 to the negative reference voltage Vneg on the opposite side of the latch circuit from the read access is to enhance the strength of the (pull up) p-channel transistors 32 in each cell 14 for holding the logic "1" state stored at the true data storage node QT. This provides for an improved immunity against unwanted data flip from logic "1" to logic "0" due to the drop in the analog voltage Va,C level on the complement side of the latch circuit.

The column processing circuit 20 senses the analog signal voltages on the pairs of complementary bit lines BLT and BLC for the M columns and generates a decision output for the in-memory compute operation from those analog signal voltages. It will be noted that sampling of the analog signal voltages Va,T and Va,C is typically made by the column processing circuit 20 at two separate times, first in association with the simultaneous application of the pulse width modulated word line signals to the first word lines WL1 during the first phase p1 (at time ts1), and second in association with the simultaneous application of the pulse width modulated word line signals to the second word lines WL1 during the second phase p2 (at time ts2). Post-sampling (i.e., at or after time ts2) the bit lines are precharged back to the precharge voltage level.

Figure 10:
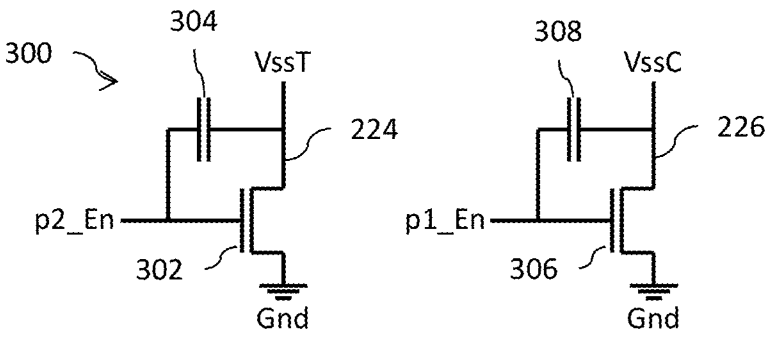
FIG. 10 is a circuit diagram for an embodiment of a circuit for providing modulated reference supply voltages.

Reference is now made to FIG. 10 which shows a circuit diagram for an embodiment of a circuit 300 within the source supply modulation circuit 222 for providing the modulated reference supply voltages VssT and VssC. The circuit 300 includes a first n-channel MOSFET device 302 having a source coupled (preferably directly connected) to the ground Gnd reference node and a drain coupled (preferably directly connected) to many if not all of the true low supply nodes 224 for the source terminals of the (pull down) n-channel transistors 34 on the true side of the latch circuits (associated with data storage node QT) which are coupled to receive the modulated reference supply voltage VssT. A gate of the transistor 302 is coupled to receive the phase p2 enable signal p2_En. A first capacitor 304 has a first terminal coupled (preferably directly connected) to the gate of transistor 302 and a second terminal coupled (preferably directly connected) to the true low supply nodes 224. A second n-channel MOSFET device 306 has a source coupled (preferably directly connected) to many if not all of the complement low supply nodes 226 for the source terminals of the (pull down) n-channel transistors 36 on the complement side of the latch circuits (associated with data storage node QC) which are coupled to receive the modulated reference supply voltage VssC. A gate of the transistor 306 is coupled to receive the phase p1 enable signal p1_En. A second capacitor 308 has a first terminal coupled (preferably directly connected) to the gate of transistor 306 and a second terminal coupled (preferably directly connected) to the complement low supply nodes 226.

The circuit 300 operates as follows. When the phase p2 enable signal p2_En and the phase p1 enable signal p1_En are deasserted (logic high), transistors 302 and 306 are turned on and a boost voltage approximately equal to the supply voltage Vdd is stored across the first and second capacitors 304 and 308. Furthermore, because transistors 302 and 306 are turned on, the voltage level at the true low supply nodes 224 and the complement low supply nodes 226 at this time is maintained at the ground Gnd reference voltage. In the first phase p1, the phase p1 enable signal p1_En is asserted (logic low), and the voltage at the complement low supply nodes 226 is boosted to the level of the negative reference voltage Vneg (wherein the negative voltage level is set by a capacitor ratio and is typically on the order of a few hundred millivolts) through the boost voltage stored on the second capacitor 308. As noted above, the negative absolute value of the voltage Vneg is limited by the retention of a logic 1 state on the latch node when the source of the same side pull down transistor is taken to the negative voltage level and the opposite side word line is asserted. Conversely, in the second phase p2, the phase p2 enable signal p2_En is asserted (logic low), and the voltage at the true low supply nodes 224 is boosted to the level of the negative reference voltage Vneg through the boost voltage stored on the first capacitor 304.

Figure 11:
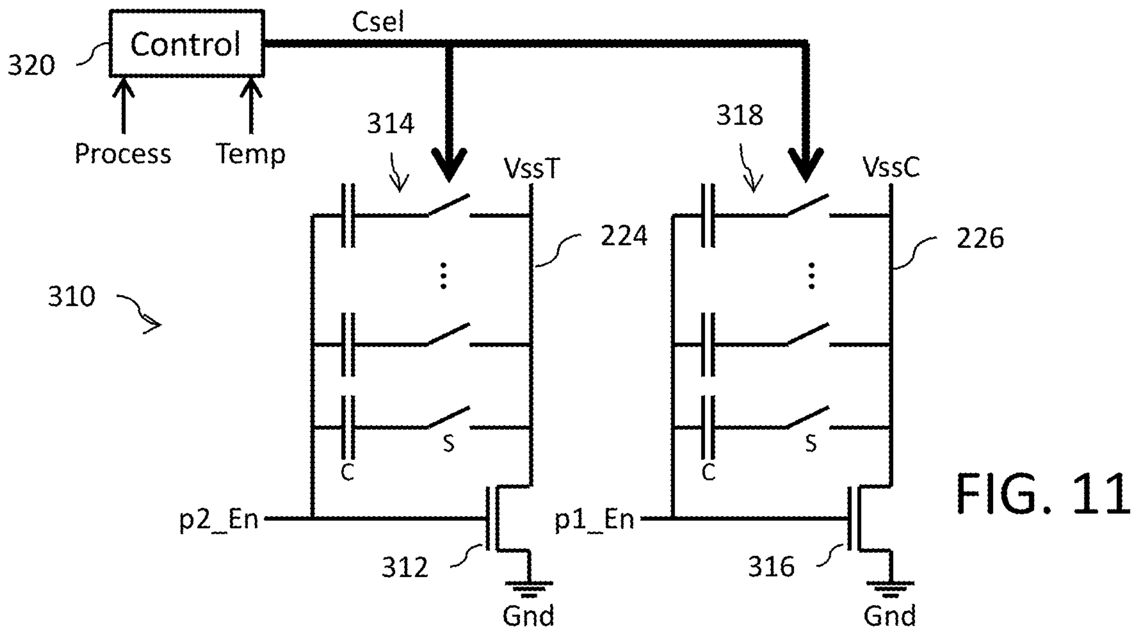
FIG. 11 is a circuit diagram for an embodiment of a circuit for providing modulated reference supply voltages.

Reference is now made to FIG. 11 which shows a circuit diagram for an embodiment of a circuit 310 within the source supply modulation circuit 222 for providing the modulated reference supply voltages VssT and VssC. The circuit 310 includes a first n-channel MOSFET device 312 having a source coupled (preferably directly connected) to the ground Gnd reference node and a drain coupled (preferably directly connected) to many if not all of the true low supply nodes 224 for the source terminals of the (pull down) n-channel transistors 34 on the true side of the latch circuits (associated with data storage node QT) which are coupled to receive the modulated reference supply voltage VssT. A gate of the transistor 312 is coupled to receive the phase p2 enable signal p2_En. A plurality of switched capacitor circuits 314 are coupled between the gate of transistor 312 and true low supply nodes 224. Each switched capacitor circuit 314 includes a capacitor C connected in series with a switch S (which may be implemented by a transistor device). A second n-channel MOSFET device 316 has a source coupled (preferably directly connected) to the ground Gnd reference node and a drain coupled (preferably directly connected) to many if not all of the complement low supply nodes 226 for the source terminals of the (pull down) n-channel transistors 36 on the complement side of the latch circuits (associated with data storage node QC) which are coupled to receive the modulated reference supply voltage VssC. A gate of the transistor 316 is coupled to receive the phase p1 enable signal p1_En. A plurality of switched capacitor circuits 318 are coupled between the gate of transistor 316 and the complement low supply nodes 226. Each switched capacitor circuit 318 includes a capacitor C connected in series with a switch S (which may be implemented by a transistor device). A digital control circuit 320 generates a multi-bit digital control signal Csel that selectively actuates the one or more of the switches S of the switched capacitor circuits 314 and 318 in connection with controlling the level of the generated negative reference voltage Vneg.

The circuit 310 operates in a manner similar to the circuit 300, except that circuit 310 allows for modulation of the level of the negative reference voltage Vneg through selective switch S actuation. The more switches S that are actuated, the more negative the generated negative reference voltage Vneg. Modulation of the strength of the pull up transistor in the memory cell 14 is needed in order to ensure the stability of the stored data. With the selective actuation of the switches S, it is possible to optimize the pull up strength modulation without wasting additional energy. This strength modulation can be dependent on integrated circuit process and/or temperature information. For example, if process information indicates that the MOSFET devices of the memory cells 12 are at the fast-slow process corner (where NMOS speed is fast and PMOS speed is slow), the digital control circuit 320 can assert bits of the multi-bit digital control signal Csel so as to control the selection of switched capacitor circuits 314 and 318 to provide a relatively higher voltage level for the negative reference voltage Vneg (for example, higher than a nominal or typical negative voltage level). Similarly, if the temperature information indicates a relatively lower temperature, a lower absolute value for the negative voltage level can be selected through the multi-bit digital control signal Csel; and conversely for a relatively higher temperature selection can instead be made of a higher absolute value for the negative voltage level.

Figure 12:
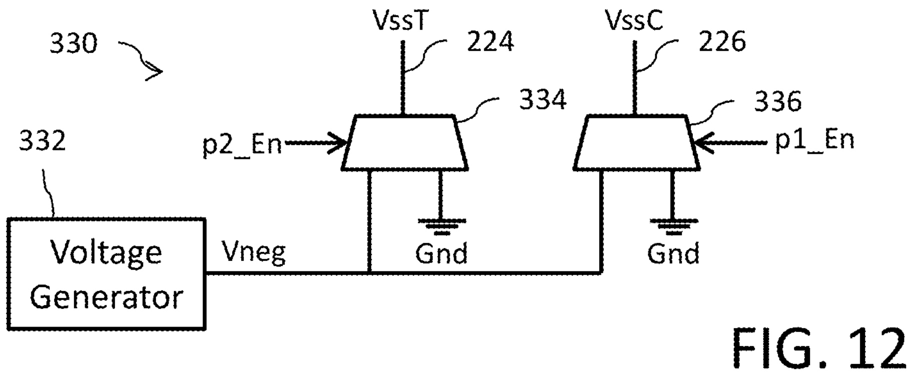
FIG. 12 is a circuit diagram for an embodiment of a circuit for providing modulated reference supply voltages.

Reference is now made to FIG. 12 which shows a circuit diagram for an embodiment of a circuit 330 within the source supply modulation circuit 222 for providing the modulated reference supply voltages VssT and VssC. The circuit 330 includes a voltage generator circuit 332 configured to generate the negative reference voltage Vneg. The voltage generator circuit 332 may, for example, comprise a voltage regulator circuit (such as a low drop-out (LDO) regulator) that generates the negative reference voltage Vneg from an input voltage. Alternatively, the voltage generator circuit 332 may, for example, comprise a charge pump circuit that generates the negative reference voltage Vneg from the supply voltage Vdd.

A first switching circuit 334, illustrated here by example only as an analog multiplexing circuit, has a first input configured to receive the negative reference voltage Vneg output from the voltage generator circuit 332 and the second input configured to receive the ground Gnd reference voltage. An output of the first switching circuit 334 is coupled (preferably directly connected) to many if not all of the true low supply nodes 224 for the source terminals of the (pull down) n-channel transistors 34 on the true side of the latch circuits (associated with data storage node QT) which are coupled to receive the modulated reference supply voltage VssT. The selection operation performed by the first switching circuit 334 is controlled by the phase p2 enable signal p2_En. When the phase p2 enable signal p2_En is deasserted, the first switching circuit 334 applies the ground Gnd reference voltage as the modulated reference supply voltage VssT. Conversely, when the phase p2 enable signal p2_En is asserted, the first switching circuit 334 applies the negative reference voltage Vneg as the modulated reference supply voltage VssT.

A second switching circuit 336, illustrated here by example only as an analog multiplexing circuit, has a first input configured to receive the negative reference voltage Vneg output from the voltage generator circuit 332 and the second input configured to receive the ground Gnd reference voltage. An output of the second switching circuit 336 is coupled (preferably directly connected) to many if not all of the complement low supply nodes 226 for the source terminals of the (pull down) n-channel transistors 36 on the complement side of the latch circuits (associated with data storage node QC) which are coupled to receive the modulated reference supply voltage VssC. The selection operation performed by the second switching circuit 336 is controlled by the phase p1 enable signal p1_En. When the phase p1 enable signal p1_En is deasserted, the second switching circuit 336 applies the ground Gnd reference voltage as the modulated reference supply voltage VssC. Conversely, when the phase p1 enable signal p1_En is asserted, the second switching circuit 336 applies the negative reference voltage Vneg as the modulated reference supply voltage VssC.

Figure 13:
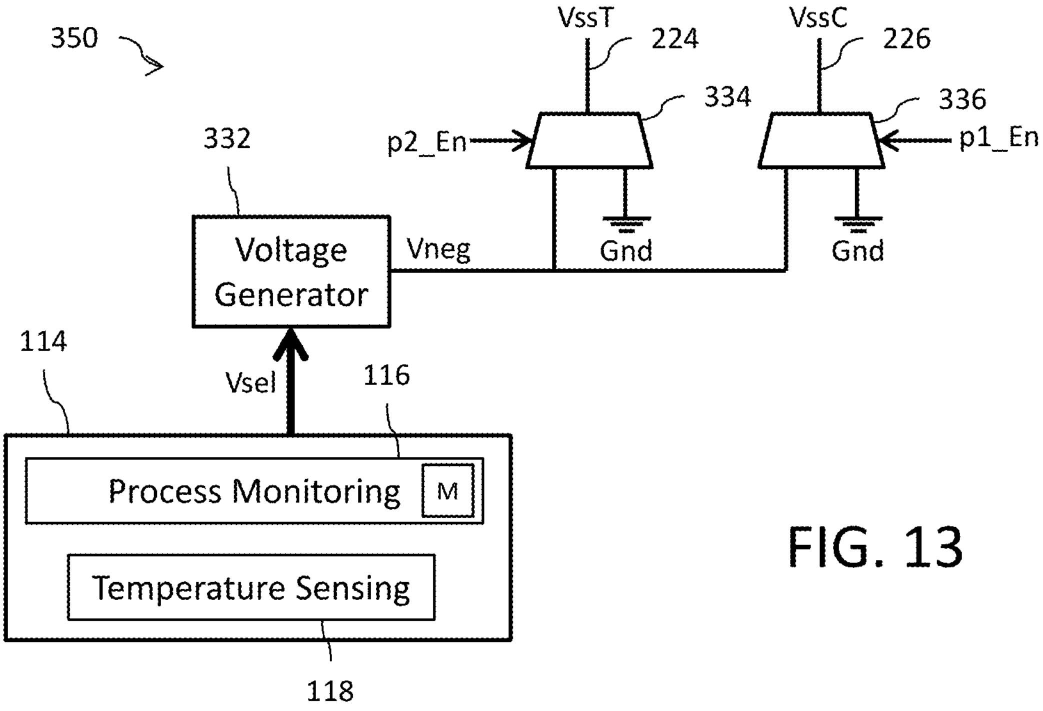
FIG. 13 is a circuit diagram for an embodiment of a circuit for providing modulated reference supply voltages.

Reference is now made to FIG. 13 which shows a circuit diagram for an embodiment of a circuit 350 within the source supply modulation circuit 222 for providing the modulated reference supply voltages VssT and VssC. Like references in FIGS. 12 and 13 refer to like or similar components, the description of which will not be repeated (see, description above). The circuit 350 differs from the circuit 330 in that the level of the negative reference voltage Vneg is modulated dependent on integrated circuit process and/or temperature conditions.

The voltage generator circuit 332 receives a control signal Vsel which in an embodiment is a digital signal, but may alternatively be an analog control signal. The digital values of the bits of the control signal Vsel select the level of the negative reference voltage Vneg output by the voltage generator circuit 332. The control signal Vsel is generated by a control circuit 114 in response to integrated circuit process and/or temperature information, and thus the level of the negative reference voltage Vneg is modulated in a manner which is dependent on that integrated circuit process and/or temperature information.

The integrated circuit process information is a digital code stored in a memory M within the control circuit 114. The digital code represents the centering of the process lot and is generated by circuitry such as, for example, ring oscillators (RO) whose output frequency varies dependent on integrated circuit process. The output frequencies of the RO circuits thus represent the process centering and can easily be converted into a digital code (for example, through the use of counter circuits). A process monitoring circuit 116 within the control circuit 114 can generate the digital value of the control signal Vsel as a function of the stored digital code for the integrated circuit process. For example, the process monitoring circuit 116 may include a look-up table (LUT) that correlates each digital code with a digital value of the control signal Vsel for providing a specific level of the negative reference voltage Vneg that will produce an optimal level of enhancement for the strength of the (pull up) p-channel transistors in each cell 14 for holding the logic "1" state and ensuring against unwanted date flip given the integrated circuit process corner. The control circuit 114 outputs the digital value of the control signal Vsel correlated to the stored digital code and the voltage generator circuit 332 responds by generating the corresponding level for the negative reference voltage Vneg.

The temperature information is generated by a temperature sensing circuit 118 and represents a current temperature of the integrated circuit. The temperature sensing circuit 118 may select, modify or adjust the digital value of the control signal Vsel as a function of the sensed temperature. For example, the temperature sensing circuit 118 may include a look-up table (LUT) that specifies a certain (positive or negative) adjustment in the digital value of the control signal Vsel for providing a corresponding tuning of the specific level of the negative reference voltage Vneg that will produce optimal performance given the integrated circuit process corner and current temperature condition.

Figure 14:
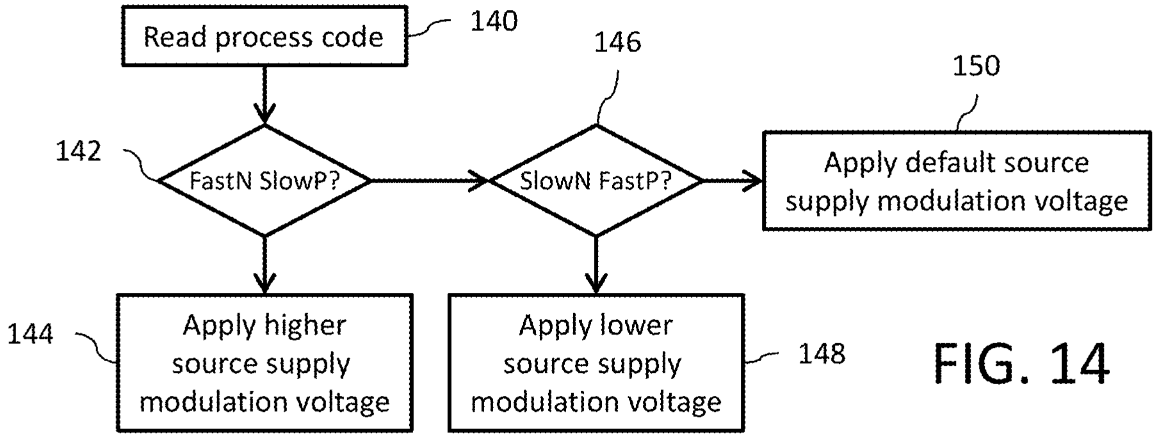
FIG. 14 is a flow diagram.

Reference is now made to FIG. 14 which shows a flow diagram for operation of the control circuit 114 and process monitoring circuit 116 for the circuit of FIG. 13. In step 140, the stored digital code for the integrated circuit process is read from the memory M. In an embodiment, the digital code for the integrated circuit process is loaded at the factory into the memory M, and this digital code is based on the identified integrated circuit process characteristic (fast/slow corner, etc.) for the integrated circuit fabrication lot (for example, the source wafer) from which the integrated circuit is obtained. Next, in step 142, a determination is made as to whether the read digital code for the integrated circuit process indicates that the MOSFET devices of the memory cells 12 are at certain integrated circuit process corner (e.g., where and NMOS speed is fast and PMOS speed is slow—the "FS" corner). If yes, then a digital value of the control signal Vsel is selected in step 144 which corresponds to the read digital code and which will cause the voltage generator circuit 332 to generate a level for the negative reference voltage Vneg that is higher than a nominal (or default or typical) level). The effect of the higher than the nominal level is to increase the strength of the pull up transistors and provide better stability and resistance to bit cell flip. If no in step 142, then in step 146 a determination is made as to whether the read digital code for the integrated circuit process indicates that the MOSFET devices of the memory cells 12 are at another integrated circuit process corner (e.g., where NMOS speed is slow and PMOS speed is fast—the "SF" corner). If yes, then a digital value of the control signal Vsel is selected in step 148 which corresponds to the read digital code and which will cause the voltage generator circuit 332 to generate a level for the negative reference voltage Vneg that is lower than the nominal (or default or typical) level). The effect of the lower than the nominal level is to ensure bit cell stability with an optimal negative voltage level that saves power. If no in step 146, then in step 150 a digital value of the control signal Vsel is selected which corresponds to the read digital code and which will cause the voltage generator circuit 332 to generate a level for the negative reference voltage Vneg that is equal to the nominal level.

Although the process of FIG. 14 contemplates three levels of voltage control (higher than, lower than, and equal to, nominal), it will be understood that this is by example only. Additional testing steps may be added to the process of FIG. 14 to test for other integrated circuit process corner or process-related conditions, with each test having an associated digital code and digital value of the control signal Vsel for setting a corresponding level of the negative reference voltage Vneg generated by the voltage generator circuit 332.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method for accessing a memory array during an in-memory compute operation, the memory array storing weight data for the in-memory compute operation and including a plurality of memory cells, each memory cell comprising a latch circuit including a first side with a first data storage node and a first low supply node coupled to a first modulated reference supply voltage and further including a second side with a second data storage node and a second low supply node coupled to a second modulated reference supply voltage, wherein the plurality of memory cells are arranged in a matrix with plural rows and plural columns, each column including a pair of bit lines connected to the memory cells of the column, and each row including a first word line connected to the first side of the latch circuit and a second word line connected to the second side of the latch circuit, the method comprising:

simultaneously applying pulses having pulse widths modulated by feature data of the in-memory compute operation only to the first word lines in a first phase of the in-memory compute operation;

switching the second modulated reference supply voltage for the second data storage node at the second low supply node, but not at the first low supply node, from a ground voltage to a negative voltage during the first phase;

then simultaneously applying pulses having pulse widths modulated by feature data of the in-memory compute operation only to the second word lines in a second phase of the in-memory compute operation;

switching the first modulated reference supply voltage for the first data storage node at the first low supply node, but not at the second low supply node, from the ground voltage to the negative voltage during the second phase; and processing analog voltages developed on the pairs of bit lines in response to the first and second phases of the in-memory compute operation to generate a decision output for the in-memory compute operation.

2. The method of claim 1, further comprising controlling a level of the negative voltage dependent on information concerning integrated circuit process conditions.

3. The method of claim 1, further comprising controlling a level of the negative voltage dependent on information concerning integrated circuit temperature conditions.

4. The method of claim 1, wherein switching to the negative voltage comprises performing a voltage boosting to generate said negative voltage, and wherein a level of the negative voltage is dependent on information concerning integrated circuit process and/or temperature conditions.

5. The method of claim 1, wherein switching to the negative voltage comprises:

generating the negative voltage; and controlling a level of the negative voltage in response to a control signal;

wherein the control signal is configured to cause modulation of the level of the negative voltage away from a nominal level in response to an applicable integrated circuit process corner for transistor devices of the memory cells.

6. The method of claim 5, wherein the applicable integrated circuit process corner is indicated by a programmed code, and further comprising storing the programmed code in a lookup table (LUT) which correlates the programmed code to a value of the control signal.

7. The method of claim 5, further comprising sensing temperature, and wherein the control signal is configured to cause a temperature dependent tuning of the level of the negative voltage.

8. The method of claim 7, further comprising storing in a lookup table (LUT) a correlation between temperature and a tuning level for the value of the control signal.

9. The method of claim 1, wherein switching to the negative voltage comprises:

generating the negative voltage;

sensing temperature; and controlling a level of the negative voltage away from a nominal level in response to the sensed temperature.

10. The method of claim 9, further comprising storing in a lookup table (LUT) a correlation between temperature and a tuning level for the value of the negative voltage.

11. A method for accessing a memory array during an in-memory compute operation, the memory array including a plurality of memory cells, each memory cell comprising a latch circuit including a first side with a first data node and a first low supply node coupled to a first modulated reference supply voltage and further including a second side with a second data node and a second low supply node coupled to a second modulated reference supply voltage, wherein the plurality of memory cells are arranged in a matrix with plural rows and plural columns, each column including a pair of bit lines connected to the memory cells of the column, and each row including a first word line connected to the first side of the latch circuit and a second word line connected to the second side of the latch circuit, the method comprising:

simultaneously applying pulses only to the first word lines in a first phase of the in-memory compute operation;

switching the second modulated reference supply voltage at the second low supply node from a ground voltage to a negative voltage during the first phase, wherein the first modulated reference supply voltage at the first low supply node is held at the ground voltage during the first phase;

then simultaneously applying pulses only to the second word lines in a second phase of the in-memory compute operation;

switching the first modulated reference supply voltage at the first low supply node from the ground voltage to the negative voltage during the second phase, wherein the second modulated reference supply voltage at the second low supply node is held at the ground voltage during the second phase; and processing analog voltages developed on the pairs of bit lines in response to the first and second phases of the in-memory compute operation to generate a decision output for the in-memory compute operation.

12. The method of claim 1, further comprising:

reading data from the first data node on the first side of the latch during the first phase; and reading data from the second data node on the second side of the latch during the second phase.

13. The method of claim 12, further comprising controlling a level of the negative voltage dependent on information concerning integrated circuit process conditions.

14. The method of claim 12, further comprising controlling a level of the negative voltage dependent on information concerning integrated circuit temperature conditions.

15. The method of claim 12, wherein switching to the negative voltage comprises performing a voltage boosting to generate said negative voltage, and wherein a level of the negative voltage is dependent on information concerning integrated circuit process and/or temperature conditions.

16. The method of claim 12, wherein switching to the negative voltage comprises:

generating the negative voltage; and controlling a level of the negative voltage in response to a control signal;

wherein the control signal is configured to cause modulation of the level of the negative voltage away from a nominal level in response to an applicable integrated circuit process corner for transistor devices of the memory cells.

17. The method of claim 16, wherein the applicable integrated circuit process corner is indicated by a programmed code, and further comprising storing the programmed code in a lookup table (LUT) which correlates the programmed code to a value of the control signal.

18. The method of claim 16, further comprising sensing temperature, and wherein the control signal is configured to cause a temperature dependent tuning of the level of the negative voltage.

19. The method of claim 18, further comprising storing in a lookup table (LUT) a correlation between temperature and a tuning level for the value of the control signal.

20. The method of claim 12, wherein switching to the negative voltage comprises:

generating the negative voltage;

sensing temperature; and controlling a level of the negative voltage away from a nominal level in response to the sensed temperature.

21. The method of claim 20, further comprising storing in a lookup table (LUT) a correlation between temperature and a tuning level for the value of the negative voltage.

22. The method of claim 12, further comprising:

reading data from the first data node on the first side of the latch during the first phase; and reading data from the second data node on the second side of the latch during the second phase.

* * * * *